United States Patent [19]

Oshita et al.

[11] Patent Number: 4,874,438
[45] Date of Patent: Oct. 17, 1989

[54] INTERMETALLIC COMPOUND SEMICONDUCTOR THIN FILM AND METHOD OF MANUFACTURING SAME

[75] Inventors: Masahide Oshita; Masaaki Isai, both of Hamamatsu; Toshiaki Fukunaka, Samukawa, all of Japan

[73] Assignee: Toyo Communication Equipment Co., Ltd., Japan

[21] Appl. No.: 138,192

[22] PCT Filed: Apr. 1, 1987

[86] PCT No.: PCT/JP87/00205

§ 371 Date: Nov. 30, 1987

§ 102(e) Date: Nov. 30, 1987

[30] Foreign Application Priority Data

Apr. 1, 1986 [JP] Japan .................. 61-75114
Mar. 20, 1987 [JP] Japan .................. 62-67292

[51] Int. Cl.$^4$ ............................. H01L 43/08
[52] U.S. Cl. .................... 148/400; 148/33; 148/33.6; 148/DIG. 5; 148/DIG. 65; 148/DIG. 169; 156/610; 252/62.3 C; 420/555; 420/576; 437/96; 437/104; 437/107; 437/108; 437/112

[58] Field of Search .......... 148/33, 33.6, 400, DIG. 5, 148/DIG. 65, DIG. 169; 156/610; 420/555, 576; 437/96, 104, 107, 108, 112; 252/62.3 C

[56] References Cited

U.S. PATENT DOCUMENTS

| | | | |
|---|---|---|---|
| 2,994,621 | 8/1961 | Hugle et al. | 148/DIG. 65 |
| 3,392,056 | 7/1968 | Maskalick | 148/DIG. 169 |
| 3,514,320 | 5/1970 | Vaughan | 148/DIG. 169 |
| 3,531,335 | 9/1970 | Heyerdahl et al. | 148/DIG. 169 |
| 3,674,549 | 7/1972 | Oshita et al. | 148/DIG. 169 |
| 3,895,391 | 7/1975 | Konishi | 357/4 |
| 4,177,372 | 12/1979 | Kotera et al. | 437/19 |
| 4,269,424 | 10/1981 | Shibasaki et al. | 357/2 |
| 4,404,265 | 9/1983 | Manasevit | 148/33 |
| 4,627,724 | 12/1986 | Cameron | 250/342 |
| 4,735,396 | 4/1988 | Hamakawa et al. | 428/641 |

OTHER PUBLICATIONS

Tietjen et al., "Vapor-Phase Growth . . . ", REA Review, 12/1970, pp. 635-646.
Morris et al., "A New GaAs, GaP, and GaAs$_x$P$_{1-x}$ . . .", J. Vac. Sci. Technol., vol. 11, No. 2, Mar./Apr. 1974.
Sharma et al., "The Preparation of InSb Films", Solid-State Electronics, 1968, vol. 11, pp. 423-428.
Godinho et al., "Epitaxial Indium Arsenide . . . ", Solid-State Electronics, 1970, vol. 13, pp. 47-52.

*Primary Examiner*—L. Dewayne Rutledge
*Assistant Examiner*—David W. Schumaker
*Attorney, Agent, or Firm*—Welsh & Katz, Ltd.

[57] ABSTRACT

An intermetallic compound semiconductor thin film comprises a single crystalline deposition thin film made of a III-V group intermetallic compound having a stoichiometry composition ratio of 1:1. When forming the III-V group semiconductor thin film by an evaporation method, a substrate temperature is initially maintained at a high level while the evaporation source temperature is gradually raised, and when the intermetallic composition of the III-V group begins to deposit on the substrate, the substrate temperature is lowered while the evaporation source temperature is maintained at the same level as existed at the time when the intermetallic compound is deposited, and the deposition time is controlled.

15 Claims, 7 Drawing Sheets

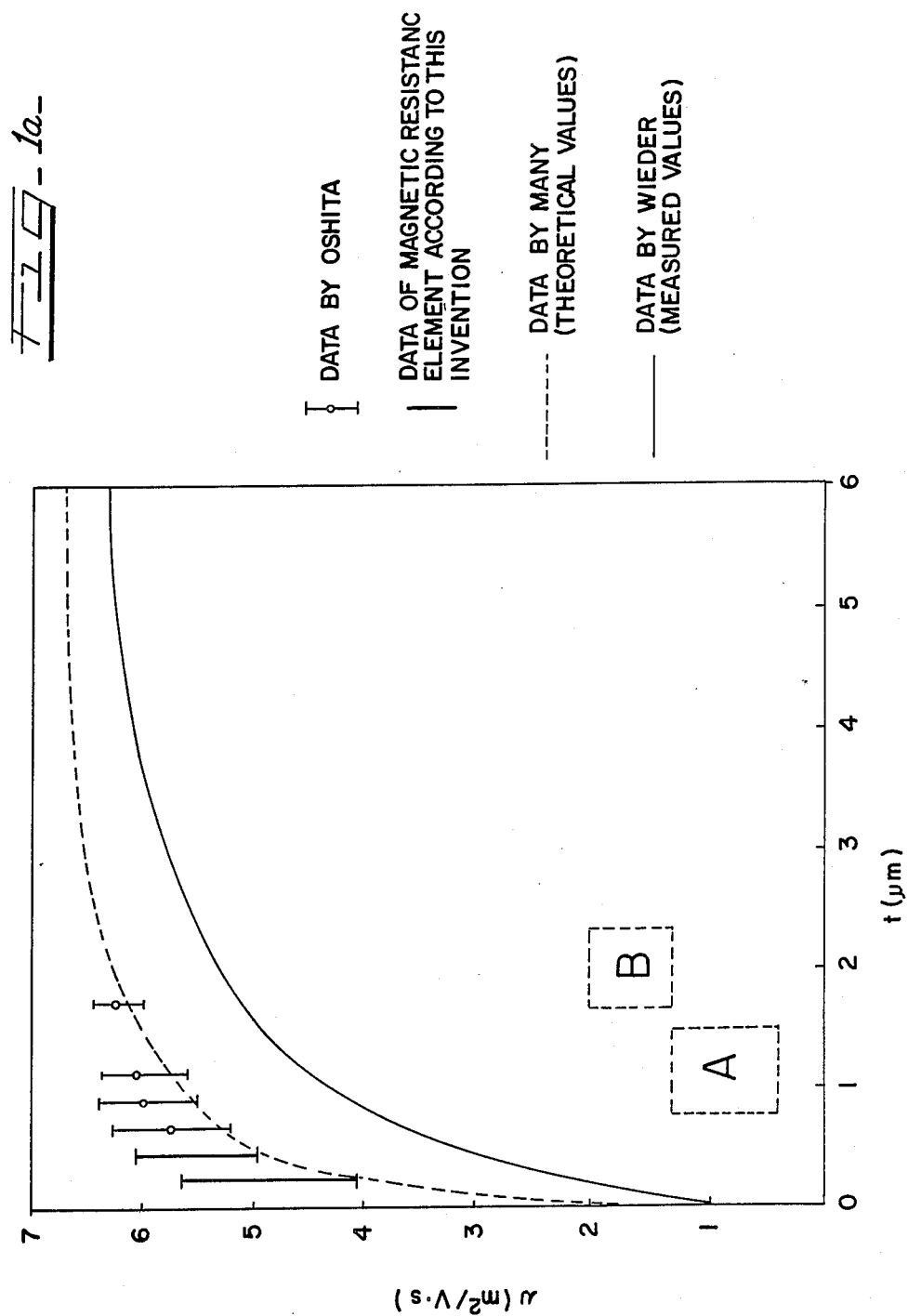

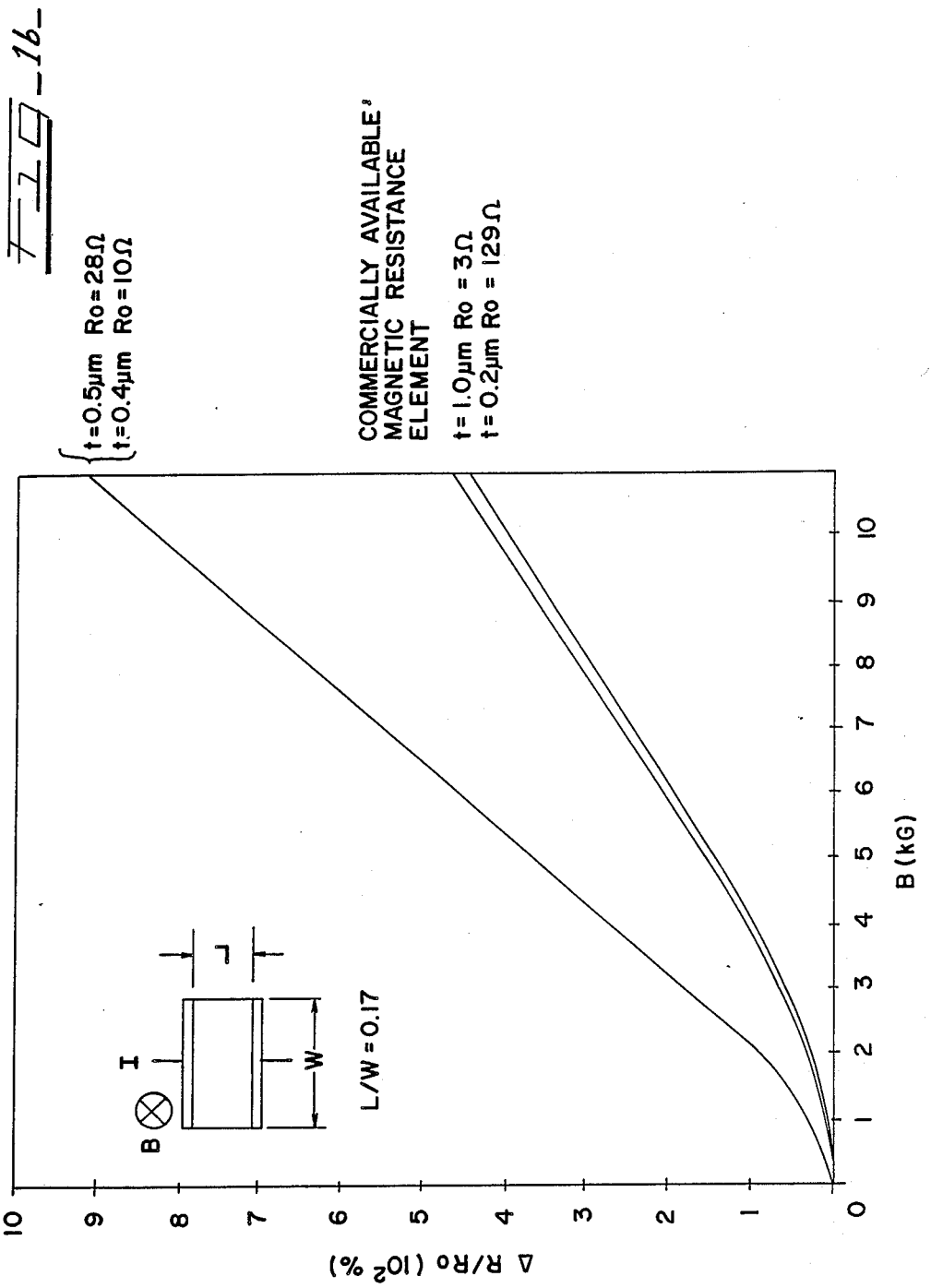

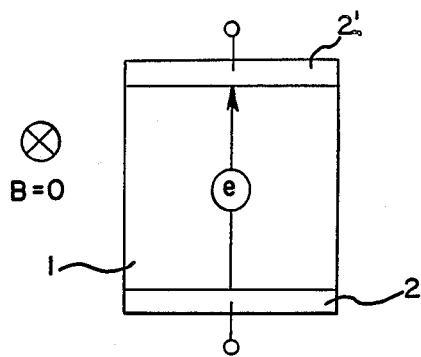
FIG_2a_
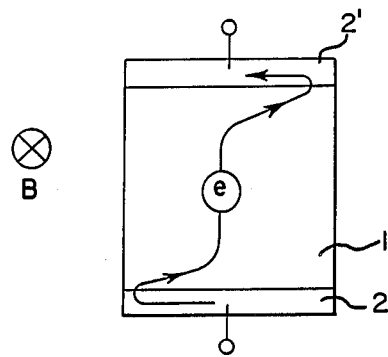
FIG_2b_
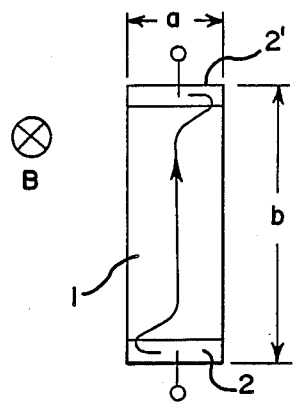
FIG_3a_
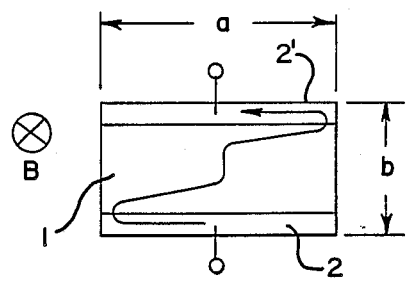
FIG_3b_
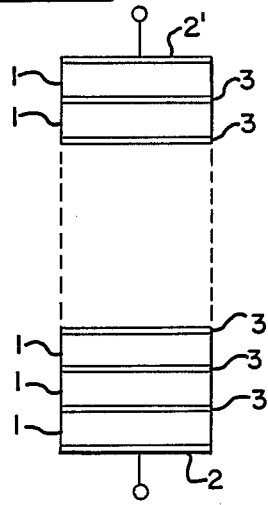
FIG_4a_
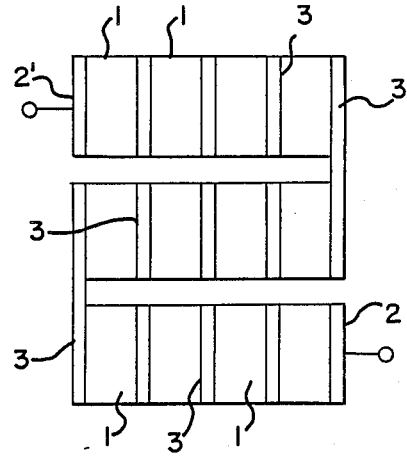
FIG_4b_

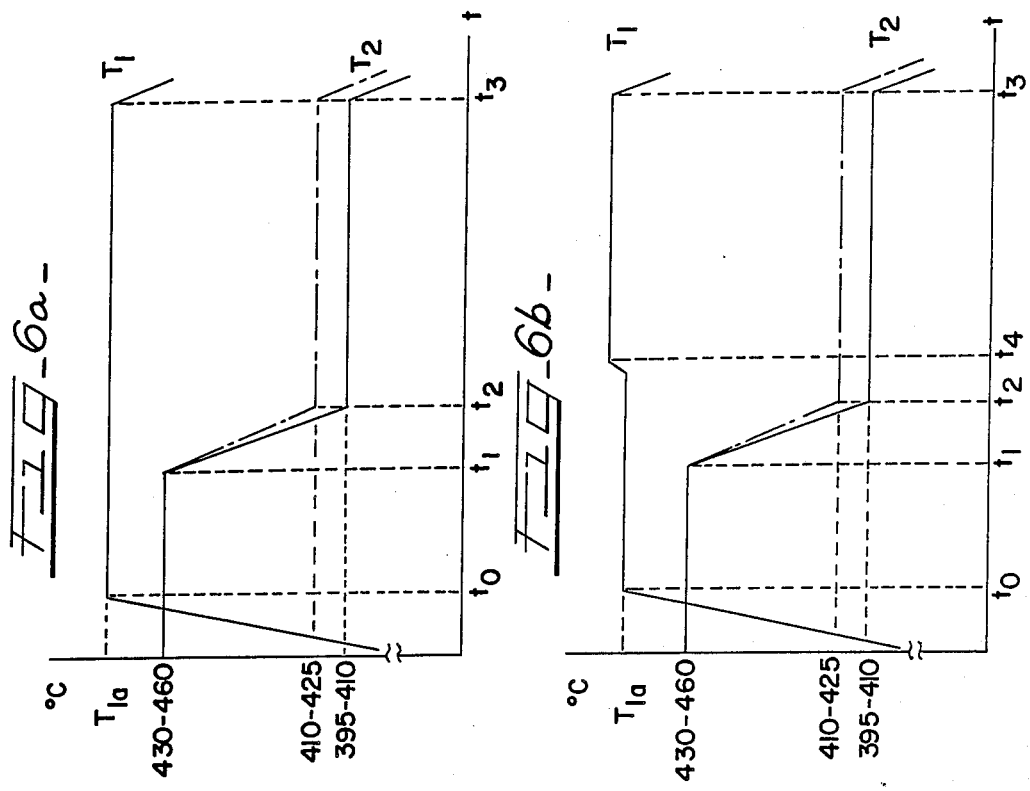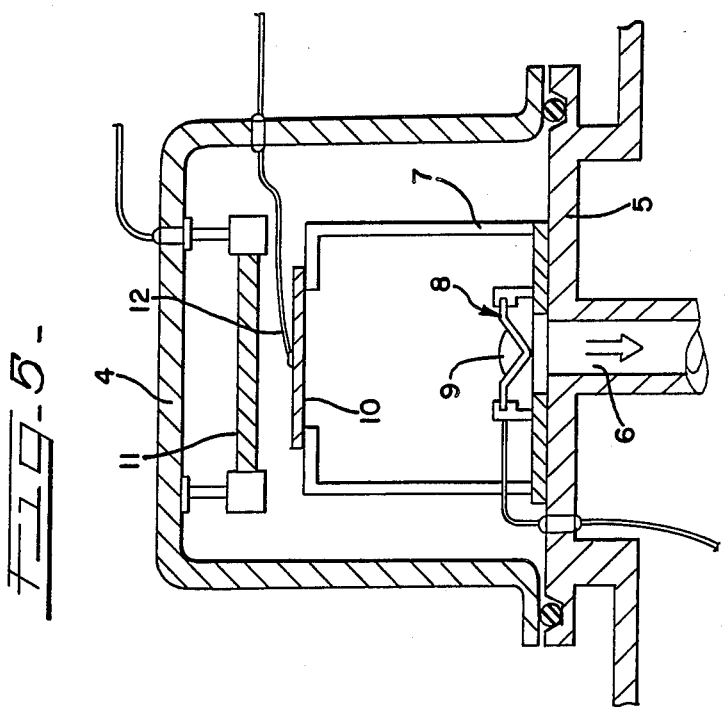

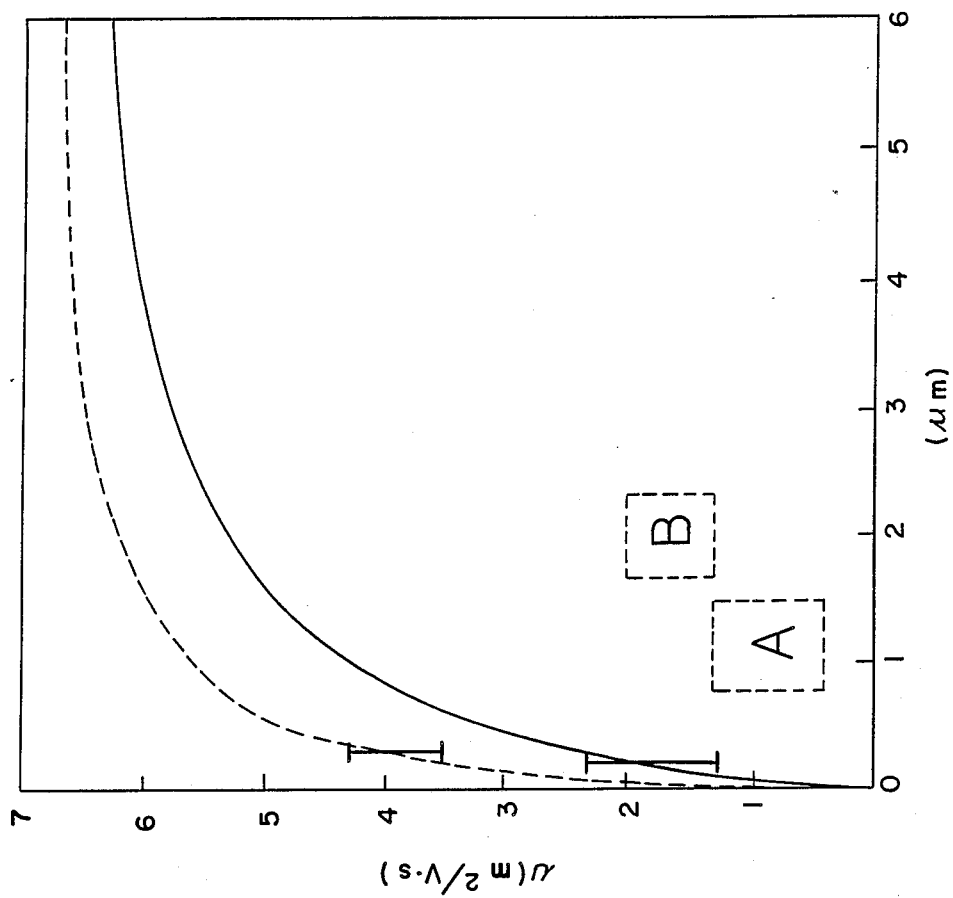

INTERMETALLIC COMPOUND SEMICONDUCTOR THIN FILM AND METHOD OF MANUFACTURING SAME

TECHNICAL FIELD

This invention relates to an intermetallic compound semiconductor thin film and a method of manufacturing the film, and more particularly to a III-V group intermetallic compound semiconductor thin film having both a high electron mobility and a high resistance value, and to a method of manufacturing such film.

BACKGROUND ART

As a substance having a magnetic resistance effect (characteristics that its resistance value varies under the influence of a magnetic field), III-V group intermetallic compounds have been known. Among them, In-Sb compound (Indium-Antimony compound) is widely known as a substance having high electron mobility which affects sensitivity (i.e., the rate of change in an element resistance value with respect to variation of a magnitude of the magnetic field). Therefore, the In-Sb compound is used as a magnetic resistance element for use in a magnetic sensor.

However, the In-Sb intermetallic compound has in itself an extremely low resistance value. Therefore, when the In-Sb intermetallic compound is used to manufacture a magnetic resistance element, the extremely low resistance value of the In-Sb intermetallic compound makes it difficult to perform impedence matching between the magnetic resistance element and an amplification circuit connected to the magnetic resistance element.

In order to compensate for the foregoing defect of the magnetic resistance element comprising an In-Sb intermetallic compound semiconductor film, measures have been contrived in which, by utilizing the shape effect a vertical-to-transversal side ratio, the magnetic resistance element is made larger so as to increase its resistance value at the sacrifice of its sensitivity, or a large number of the elements, each having a small resistance value, are connected in series so as to increase the resistance value while trying to maintain is sensitivity.

In general, a conventional magnetic resistance element comprising an In-Sb intermetallic compound semiconductor thin film has a configuration as shown in FIG. 4, the configuration being determined on the basis of a principle which will be explained with reference to FIGS. 2 and 3.

FIG. 2 is presented to explain an operational principle of a magnetic resistance element in which a magnetic resistance element 1 comprising an In-Sb intermetallic compound is provided with terminals 2 and 2' at opposing ends thereof. When electricity is applied across these terminals 2 and 2', electrons move along the shortest path between the terminals 2 and 2', as shown in FIG. 2(a), if the magnetic resistance element 1 is not under the influence of a magnetic field B. When the magnetic resistance element 1 is placed in the magnetic field B, electrons move along a curved path as shown in FIG. 2(b). Incidentally, the above-mentioned magnetic resistance effect is subjected to a so-called shape effect. In other words, the magnetic resistance effect depends on the shape of a magnetic resistance element. More particularly, as is apparant from FIGS. 3(a) and 3(b), if the element has a large sides ratio b/a, the rate of change in its resistance value is small with respect to variation in the magnitude of the magnetic field B, that is, the sensitivity of the magnetic resistance element is low although the element resistance value is large.

As described above, the conventional magnetic resistance element comprising an intermetallic compound semiconductor shows unsatisfactory characteristics both for electron mobility and for the element resistance value. To compensate for the low sensitivity, measures have been taken in which a large number of magnetic resistance elements 1 are connected in series with each other, each having a small vertical-to-transversal sides ratio, while on the thin film of the magnetic resistance elements 1, terminals 2 and 2' and short bars 3 are provided by such a method as etching as shown in FIG. 4(a).

However, in the configuration of FIG. 4(a), the magnetic resistance element 1 is long. FIG. 4(b) shows another configuration in which the long magnetic resistance element is folded at several points in order to form the magnetic resistance element in an applicable size and shape.

As mentioned earlier, the In-Sb compound has a low element resistance value, which makes it difficult to perform impedance matching with an amplifier. To obtain the magnetic resistance element of high resistance value, the element is made to be thin (less than 1 $\mu$m). In the thin element, however, electron mobility is low, that is sensitivity is low.

As a point of compromise for both electron mobility and element resistance value, a conventional In-Sb intermetallic compound semiconductor thin film is around 1 $\mu$m thick and the electron mobility thereof is $1 \times 10^4$ to $2 \times 10^4$ cm$^2$/V.sec. However, this conventional thin film has an extremely low element resistance value, although the value varies to a certain extent depending on its shape. Accordingly, it was necessary to provide the above-mentioned short bars.

In manufacturing such a conventional In-Sb semiconductor thin film, a vacuum evaporation device containing a vacuum of, for example, $2 \times 10^{-5}$ Torr is used. Inside the vacuum evaporation device, a mica substrate is disposed at high temperature on which an In-Sb polycrystal of high purity is deposited to form a thin film. The substrate temperature is kept at a temperature ranging from 380° to 420° C. for the purpose of enhancing the crystal quality and increasing the granule diameter of the In-Sb compound which is deposited. An evaporation source temperature is raised from 900° C. to 1050° C. at a temperature rising speed of about 8° C./min.

A source reports that a film having an electron mobility of $5 \times 10^4$ to $6 \times 10^4$ cm$^2$/V.sec is obtained at the film thickness of 0.8–1.2 $\mu$m by raising a mica substrate temperature from 380° C. to 420° C. at a temperature rising speed of about 2° C./min as the deposition proceeds, so as to maintain the substrate temperature at a low level in the initial period of the deposition so that re-evaporation of Sb deposited on the film is suppressed, thereby maintaining the stoichiometric composition. However, the film is of extremely low resistivity. Another source reports a method in which the mica substrate temperature is kept constant while the evaporation source temperature is increased at a predetermined speed. However, this method also provides an In-Sb semiconductor film of similar characteristics as above.

On the other hand, a conventional III-V group semiconductor thin film such as an In-Sb semiconductor thin film has a low sensitivity due to its low electron mobility. Furthermore, since the film cannot be made thin, its resistance value remains low. In order to enhance its resistance value, it is required to form metal strips called short bars on an element thin film, resulting in a complicated and expensive product.

In view of the foregoing problems, this invention is made. An object of this invention is to provide a thin semiconductor film having a high sensitivity with its resistance value being not lowered, and a method for manufacturing the film by enhancing electron mobility and by preventing reduction in its resistance value.

DISCLOSURE OF THE INVENTION

According to this invention, a semiconductor thin film comprises a single crystal deposition film made of a III-V group metal composition having a stoichiometry composition ratio of substantially 1:1. With this configuration, a thin film having a thickness of less than 0.6 $\mu$m and an electron mobility of $1 \times 10^4$ to $5 \times 10^4$ cm$^2$/V.sec can be formed. Accordingly, in a III-V group semiconductor thin film according to this invention, a high sensitivity can be achieved without reducing its resistance value.

Furthermore, according to this invention, in forming a III-V group semiconductor thin film by an evaporation method, a substrate temperature is maintained to a high level at an early stage, while an evaporation source temperature is gradually raised until the III-V group intermetallic composition starts to deposit on the substrate, and then the substrate temperature is lowered while the evaporation source temperature is maintained at the level existing at the start of deposition of the intermetallic compound, and the depositing time is controlled.

By the foregoing method, there can be formed a uniform III-V group single thin film having a stoichiometry composition ratio of substantially 1:1 over its entire surface, and an electron mobility of $1 \times 10^4$ to $5 \times 10^4$ cm$^2$/V.sec and the thickness of 0.6 $\mu$m or less.

BRIEF DESCRIPTION OF DRAWINGS

In the accompanying drawings:

FIGS. 1(a) and 1(b) are graphs showing various electrical characteristics of an embodiment of a magnetic resistance element according to this invention;

FIGS. 2(a) and 2(b) are views showing principles of magnetic resistance effects;

FIGS. 3(a) and 3(b) are views showing a relation between the vertical-to-transversal sides ratio and the sensitivity of the element (shape effect);

FIGS. 4(a) and 4(b) are views showing different configurations of conventional magnetic sensors;

FIG. 5 is a view showing an embodiment of an evaporation device for manufacturing an intermetallic compound semiconductor according to this invention;

FIGS. 6(a) and 6(b) are graphs showing a temperature control method in manufacturing a magnetic resistance element according to this invention; and FIGS. 7(a), 7(b) and 7(c) are graphs showing electric characteristics of a magnetic resistance element of another embodiment according to this invention.

BEST MODE FOR CARRYING OUT THE INVENTION

Figure 7B:
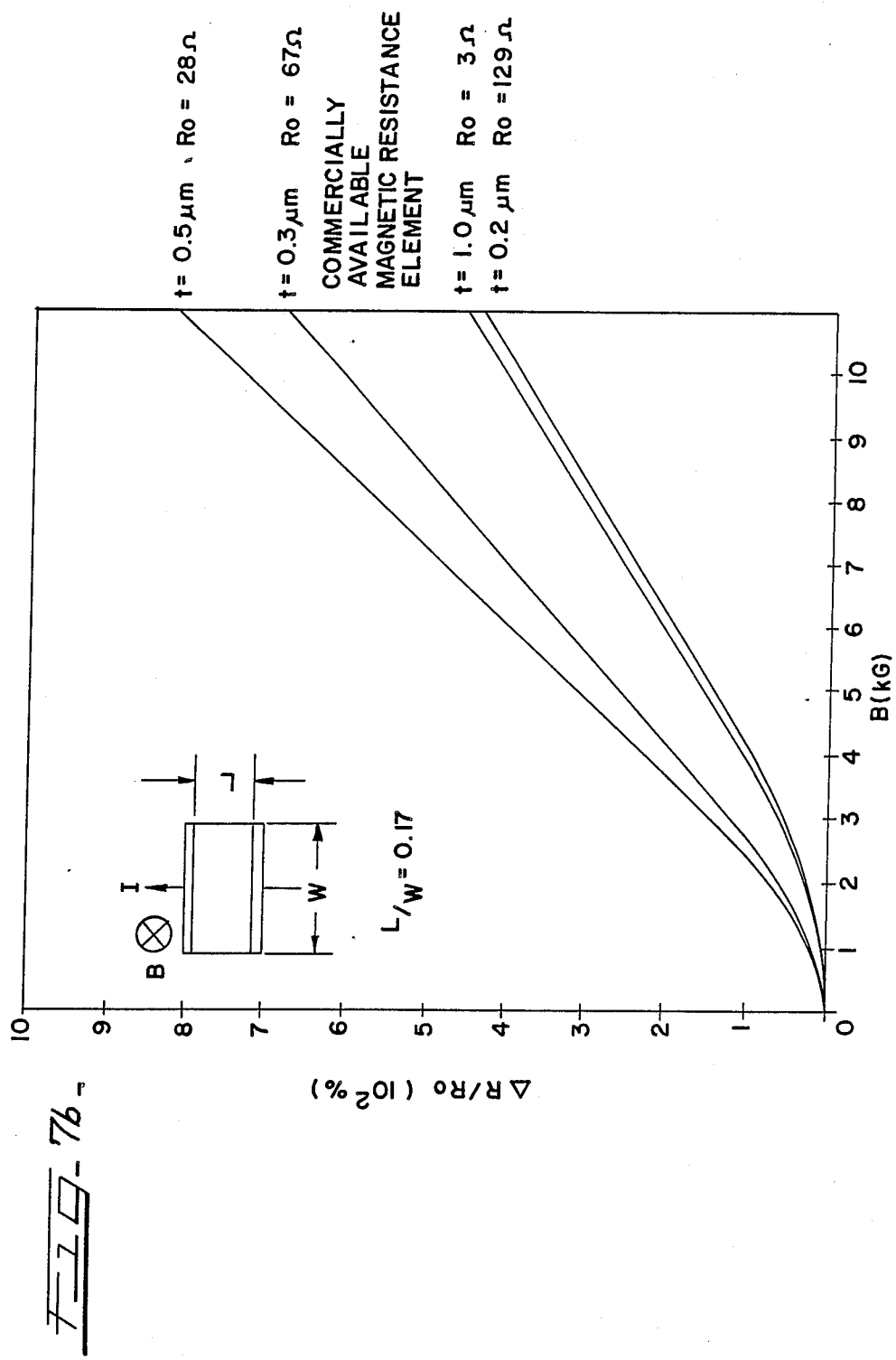

Referring to the attached drawings, an intermetallic compound semiconductor thin film and a method of manufacturing the film according to this invention will be described in detail.

FIG. 5 is a sectional view showing a basic configuration of an evaporation device for manufacturing an intermetallic semiconductor compound according to this invention.

The evaporation device comprises a base 5 provided with an exhaust port 6 formed in the middle portion thereof and a bell jar 4 fixedly mounted to the base 5 by way of a packing, the bell jar 4 serving as a vacuum chamber used for vacuum evaporation, with the air in its interior being exhausted through the exhaust port 6 by a vacuum pump (not shown) so as to keep the interior of the bell jar 4 to a predetermined vacuum level.

The bell jar 4 contains a supporting member 7 having a suitable shape and provided on the base 5, a boat formed by a suitably-shaped sheet made of Mo, W, Ta, etc. and fixed in the middle of the bottom of the supporting member 7. The boat is supplied with evaporation substance 9 comprising a volatile substance such as polycrystalline In-Sb or In-As granule. Thereafter, electricity is applied to the boat to generate resistance heat, thereby evaporating the evaporation substance 9.

Above the supporting member 7, there is provided a mica substrate 10 for carrying the evaporation substance 9 thereon, a heating member 11 such as a SiC rod provided directly above the substrate 10, and a thermocouple 12 provided in contact with the rear surface of the substrate 10 for controlling the temperature of the substrate 10.

In the evaporation device of the above-described configuration, temperature $T_1$ of the boat 8 (evaporation source) and the temperature $T_2$ of the mica substrate 10 are controlled in the following steps (see FIG. 6).

At the first step, while the pressure in the bell jar 4 is maintained to a level ranging from $10^{-4}$ to $10^{-6}$ Torr and the temperature $T_2$ of the mica substrate 10 is maintained to a level ranging from 430° to 460° C., the temperature of the boat 8 is raised such that the temperature comes to $T_{1a}$ at the time of $t_0$ so as to fuse In-Sb single crystals having a purity of five nines (99.999%) (the temperature $T_{1a}$ of the boat 8 cannot be measured, but is assumed to be around 520° C.), and thereafter an electric current applied to the boat 8 is increased to promote evaporation of the In-Sb.

Because of the difference in evaporation pressure between In and Sb, Sb is first evaporated the and In is evaporated thereafter. Since the surface temperature of the mica substrate 10 is maintained to the level ranging from 430° to 460° C. as described above, Sb is not deposited on the substrate and In is thinly deposited on the overall surface.

At the second step, as the depositing state of In on the surface of the mica substrate 10 can be clearly observed, the temperature of the boat 8 is maintained at $T_{1a}$ corresponding to the value of the current flowing through the boat 8.

At the third step, after the deposition of In onto the surface of the mica substrate 10 begins, Sb which is floating in the bell jar 4 is taken into In and thus deposited so as to an form initial nucleus. The initial nucleus is distributed comparatively sparsely. At a timing when stages moves from the deposition of In on the entire surface of the mica substrate 10 into the formation of the initial nucleus formation ($t_1$ in FIG. 6(a)), the surface temperature $T_2$ of the mica substrate 10 is lowered to a level ranging from 395° to 410° C., and this state is maintained for a predetermined length of time ($t_2$ to $t_3$ in FIG. 6(a)), the atmosphere in the vicinity of the surface 10 of the mica substrate 10 has a desired stoichiometry composition (In: Sb=1:1), thereby forming a thin film having a thickness of 0.15 to 0.6 μm. FIG. 6(b) shows the same step as shown in FIG. 6(a). In FIG. 6(b), the temperature of the boat 8 is raised by about 10° C. at the time of $t_4$ for the purpose of preventing the reevaporation of the depositions which are now on the mica substrate. This is because the depositions are reevaporated from the mica if the temperature of the boat 8 in the steady state after it is raised is held too low.

Incidentally, where the evaporation is started with the initial state in which the surface temperature $T_2$ of the mica substrate is higher than 460° C. or lower than 430° C., the thin film having a desired composition cannot be stably obtained. The reason for this is considered to be as follows. In the former case in which the temperature $T_2$ is higher than 460° C., the amount of Sb injected into the initial nucleus increases, and in the latter case in which the temperature $T_2$ is lower than 430° C., the initial nucleus reevaporates.

The intermetallic compound semiconductor thin film manufactured by the method described above may have a desired thickness by suitably controlling the deposition time ($t_2$–$t_3$ in FIG. 6). It is confirmed by an optical test (checking interference fringe) or by a mechanical (stylus) test that the film has a regular and smooth surface with no pin holes being formed. It is also confirmed by the observation using a transmission type electron microscope (TEM) that the crystalline state is of single crystalline structure having [111] direction because clear Kikuchi lines are observed in the diffraction pattern. FIGS. 1(a) and 1(b) show electrical properties of the In-Sb compound semiconductor thin film manufactured by the method described above.

FIG. 1(a) shows the relationship between the thickness and the electron mobility of In-Sb intermetallic compound semiconductor thin film in which the data obtained by Wieder, which is represented by a solid line, shows results of actual measurements in electron mobility for each thickness of films produced by etching an In-Sb allay bulk.

The data obtained by Many, which is plotted into a dot line, shows theoretical values representing electron mobility of the In-Sb intermetallic compound semiconductor thin film.

The In-Sb intermetallic compound semiconductor thin film according to this invention shows substantially the same quality as the theoretical curve of Many, and therefore is considered to be the ideal one.

Incidentally, most of the commercially available conventional In-Sb magnetic resistance thin films for use in magnetic sensors (in which insufficiency of its sensitivity and its element resistance value is compensated for by using short bars) fall within the A zone and those for use in Hall elements fall within the B zone. These facts show the superiority of the In-Sb magnetic resistance thin film according to this invention.

Since the thin film according to this invention is extremely thin, the element resistance value is sufficiently high.

FIG. 1(b) shows data representing the sensitivity of the semiconductor thin film according to this invention in comparison with that of a conventional semiconductor film available in the market in which the thin film of this invention is higher in electron mobility μ by more than twice the conventional one, and accordingly the sensitivity can be increased more than two times under the condition where the vertical-and-transversal sides ratio is fixed. Furthermore, since the film has high electron mobility, even in a reduced film thickness, the element resistance value can be made extremely high.

Although the description has been made based on results of an experiment on an In-Sb semiconductor thin film, this invention is not limited to the In-Sb semiconductor thin film. Accordingly, an In-As semiconductor (Indium-Arsinic semiconductor) thin film having an extremely high electron mobility can be obtained by the method of this invention. While a conventional In-As semiconductor thin film having a thickness of approximately μm has electron mobility of less than $1 \times 10^4$ cm$^2$V/sec, the semiconductor thin film manufactured according to this invention, having a thickness of less than 0.6 μm an electron mobility of $1 \times 10^4$ to $2 \times 10^4$ cm$^2$/V.sec.

In the embodiment described above, the temperature of the substrate is started to be lowered at a timing when the formation of an initial nucleus begins on the surface of the substrate so that it reaches within a temperature range of between 395° and 410° C. However, the temperature range is not limited to the above range. For example, the temperature range may be set from 410° to 425° C. as shown by a dot-dash-line in FIGS. 6(a) and 6(b). When other conditions are set to be the same as above, it is confirmed that the In-As semiconductor thin film has an electron mobility of about $1 \times 10^4$ to $2 \times 10^4$ cm$^2$/V.sec.

FIGS. 7(a) and 7(b) are views corresponding to FIGS. 1(a) and 1(b) when the temperature range is set to be from 410° to 425° C. As is apparant from FIGS. 7(a) and 7(b), even when the temperature range is set to be from 410° to 425° C., the advantageous effect of this invention can be achieved.

Figure 7C:
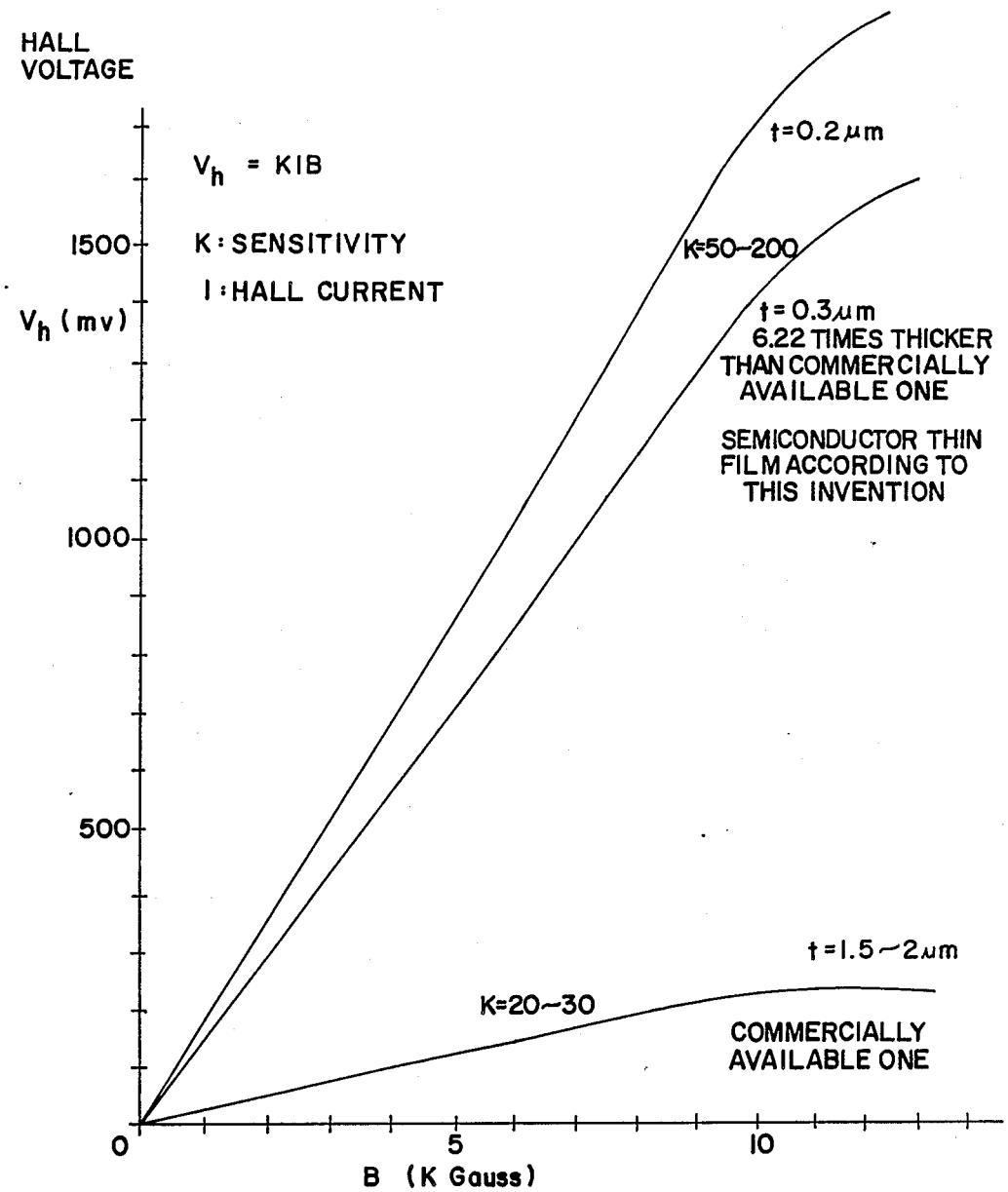

FIG. 7(C) shows data obtained from an experiment on the variation of Hall voltage Vh for the magnetic field B where the In-Sb semiconductor thin film is applied to the Hall element in comparison with a conventional thin film previously sold in the market. As is apparant from FIG. 7(c), the sensitivity K of the thin film according to this invention shows a maximum value of 50 to 200 (mV/mAKG), about six times larger than that of a conventional value of 20 to 30 (mV/mAKG), that is, the sensitivity is increased about six times.

Among conditions for manufacturing the intermetallic compound semiconductor thin film according to this invention, the board temperature, by which In-Sb or In-As is fused, was not clearly specified because no accurate temperature measuring means could be found. Furthermore, since the temperature condition seems to depend on its structure, when manufacturing the semiconductor thin film according to this invention on a mass production basis, it is preferably firstly to determine the deposition device and thereafter to chose the optimum current value to be applied to the boat through experiments, and to control the optimum value by a program.

The semiconductor thin film deposited on the surface of the mica is transferred onto a substrate made of ferrite or ceramics in a suitable shape and is attached to the substrate by using an adhesive substance, and thereafter input/output terminals are provided to the film so as to constitute a two-port magnetic sensor or a four-port Hall element.

In the intermetallic compound semiconductor thin film according to this invention manufactured by the method described above, electron mobility higher than two times than that of a conventional film can be achieved in an extremely thin film. Accordingly, when this film is applied to a two-port magnetic sensor, a high sensitivity can be obtained. Furthermore, since this film has a high element resistance value it is easy to take impedance matching to peripheral circuits. Treating additional modifications such as deposition of short bars will be unnecessary. Only connecting several elements in series will be sufficient. Therefore, the manufacturing cost is very low. Furthermore, when this film is used as a Hall element, a Hall element having a high sensitivity can be obtained.

Furthermore, it is confirmed that among the magnetic resistance elements produced according to this invention, those having a thin thickness are of the p type semiconductor. Therefore, by combining this p type semiconductor film and an n type semiconductor film, there is a possibility of realizing a p-n type semiconductor amplifying device or optical device having an extremely high operational speed.

INDUSTRIAL APPLICABILITY

The semiconductor thin film according to this invention has a great potential for application in the industrial field because the electron mobility can be enhanced without reducing the resistance value, the sensitivity can be enhanced without making a higher film thickness, and the cost of manufacturing is low.

What is claimed is:

1. A method for manufacturing an intermetallic compound semiconductor thin film comprising the steps of:
   (a) providing an evaporation source containing a III-V Group intermetallic composition;
   (b) providing a deposition substrate and raising the deposition substrate temperature to a first elevated level;
   (c) maintaining said deposition substrate temperature at said first elevated level while gradually increasing the temperature of said evaporation source to vaporize said III-V Group intermetallic composition;
   (d) passing vapors from said evaporation source to said deposition substrate;
   (e) terminating the increase in temperature of the evaporation source when an early stage of the deposition of a thin film of III Group material occurs on the surface of said deposition substrate;
   (f) maintaining the temperature of the evaporation source at the temperature where said early stage of film deposition occurs on the deposition substrate to begin deposition of a III-V Group intermetallic compound on said deposition substrate;
   (g) lowering the temperature of said deposition substrate to a predetermined second elevated level of temperature below said first elevated level when formation of an initial nucleus of III-V Group intermetallic compound begins on the surface of said deposition substrate; and
   (h) maintaining said deposition substrate temperature at said predetermined second elevated level for a predetermined amount of time to produce a III-V Group intermetallic compound semiconductor thin film on the surface of said deposition substrate.

2. The method of manufacturing an intermetallic compound semiconductor thin film as set forth in claim 1 wherein said predetermined second elevated level of temperature is maintained between about 395° C. and about 425° C.

3. A method according to claim 2 wherein said III-V Group intermetallic composition comprises In-Sb, and said III-V Group intermetallic compound semiconductor thin film comprises In-Sb having a thickness of from about 0.15 to about 0.6μm, an electron mobility of from about $10^4$ to about $5 \times 10^4$ cm$^2$/V.sec, and a stoichiometric composition ratio of In to Sb of about 1:1.

4. A method according to claim 2 wherein said III-V Group intermetallic composition comprises In-As, and said III-V Group intermetallic compound semiconductor thin film comprises In-As having a thickness of from about 0.15 to about 0.6μm, an electron mobility of from about $10^4$ to about $2 \times 10^4$ cm$^2$/V.sec, and a stoichiometric composition ratio of In to As of about 1:1.

5. An intermetallic compound semiconductor thin film manufactured by the method of claim 2.

6. The method of manufacturing an intermetallic compound semiconductor thin film as set forth in claim 1 wherein said predetermined second elevated level of temperature is maintained between about 395° C. and about 410° C.

7. A method according to claim 6 wherein said III-V Group intermetallic composition comprises In-Sb, and said III-V Group intermetallic compound semiconductor thin film comprises In-As As having a thickness of from about 0.15 to 0.6μm, an electron mobility of from about $10^4$ to about $5 \times 10^4$ cm$^2$/V.sec, and a stoichiometric composition ratio of In to Sb of about 1:1.

8. A method according to claim 6 wherein said III-V Group intermetallic composition comprises In-As, and said III-V Group intermetallic compound semiconductor thin film comprises In-As having a thickness of from about 0.15 to 0.6μm, an electron mobility of from about $10^4$ to about $2 \times 10^4$ cm$^2$/V.sec, and a stoichiometric composition ratio of In to As of about 1:1.

9. An intermetallic compound semiconductor thin film manufactured by the method of claim 6.

10. A method according to claim 1 wherein said III-V Group intermetallic composition comprises In-Sb, and said III-V Group intermetallic compound semiconductor thin film comprises In-Sb having a thickness of from about 0.15 to about 0.6μm, an electron mobility of from about $10^4$ to about $5 \times 10^4$ cm$^2$/V.sec, and a stoichiometric composition ratio of In to Sb of about 1:1.

11. A method according to claim 1 wherein said III-V Group intermetallic composition comprises In-As, and said III-V Group intermetallic compound semiconductor thin film comprises In-As having a thickness of from about 0.15 to about 0.6μm, an electron mobility of from about $10^4$ to about $2 \times 10^4$ cm$^2$/V.sec, and a stoichiometric composition ratio of In to As of about 1:1.

12. An intermetallic compound semiconductor thin film manufactured by the method of claim 1.

13. A method according to claim 1 further comprising the step of raising the temperature of the evaporation source by about 10° C. at a time while said deposition substrate temperature is maintained at said predetermined second elevated level, and maintaining the raised temperature of the evaporation source while said deposition substrate temperature is maintained at said predetermined second elevated level to prevent reevaporation of the depositions on the deposition substrate.

14. An intermetallic compound semiconductor thin film comprising a single crystal deposition film of In-Sb having a thickness of from about 0.15 to about 0.6μm, an electron mobility from about $10^4$ to about $5 \times 10^4$ cm$^2$/V.sec, and a stoichiometric composition ratio of In to Sb of about 1:1.

15. An intermetallic compound semiconductor thin film comprising a single crystal deposition film of In-As having a thickness of from about 0.15 to about 0.6 μm, an electron mobility from about $10^4$ to about $5\times10^4$ cm$^2$/V.sec, and a stoichiometric composition ratio of In to As of about 1:1.

* * * * *